United States Patent

Lazzari

[11] 4,197,987
[45] Apr. 15, 1980

[54] DEVICE FOR DETECTING MAGNETIC FIELDS AND METHOD OF MAKING SAME

[75] Inventor: Jean-Pierre Lazzari, Montfort L'Amaury, France

[73] Assignee: Compagnie Internationale pour l'Informatique, Paris, France

[21] Appl. No.: 911,100

[22] Filed: May 31, 1978

[30] Foreign Application Priority Data

Jun. 2, 1977 [FR] France .................. 77 16820

[51] Int. Cl.² .................. G06K 7/08; G11B 5/12; G11B 5/30
[52] U.S. Cl. .................. 235/449; 360/113; 365/157
[58] Field of Search .................. 360/113; 365/157; 235/449, 450

[56] References Cited

U.S. PATENT DOCUMENTS

| 2,780,774 | 2/1957 | Epstein | 360/113 |
|---|---|---|---|
| 3,151,316 | 9/1964 | Bobeck | 365/157 |
| 3,526,899 | 9/1970 | Speliotis et al. | 360/113 |
| 3,573,127 | 3/1971 | Root et al. | 365/157 |
| 3,634,657 | 1/1972 | Ballard et al. | 235/449 |

FOREIGN PATENT DOCUMENTS

| 2422927 | 1/1975 | Fed. Rep. of Germany | 360/113 |
|---|---|---|---|
| 1392375 | 2/1965 | France | 235/449 |
| 2055106 | 4/1971 | France | 235/449 |

Primary Examiner—Daryl W. Cook
Attorney, Agent, or Firm—Lowe, King, Price and Becker

[57] ABSTRACT

Fringing magnetic fields established by magnetic bars having parallel longitudinal axes are read from documents, such as checks, to determine a code on the document. The fringing fields extend in opposite directions to indicate the code. An array of magnetoresistive elements responsive to a DC energizing current is included so that at least one of the elements is provided for each of the fields. An alternating magnetic field of predetermined frequency and phase is coupled to each of the elements by a conductor that is effectively a single turn coil. The alternating magnetic field is superimposed on the fringing field so that the two fields are combined in each element to modulate the DC energizing current. The predetermined phase is compared with the phase of the modulated current to provide an indication of the fringing field direction and of the code. The conductors and elements are mounted in registration on a dielectric substrate, so that each substrate is effectively a plane of a three-dimensional matrix including a multiplicity of substrate planes.

22 Claims, 18 Drawing Figures

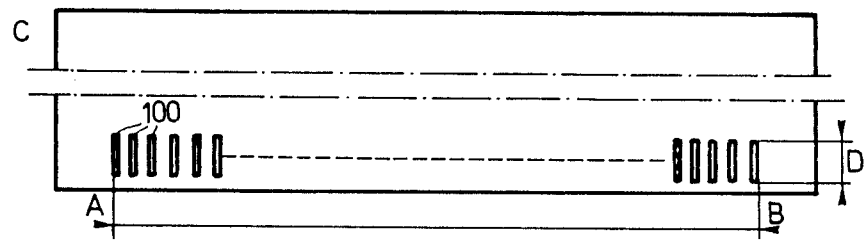
FIG:1
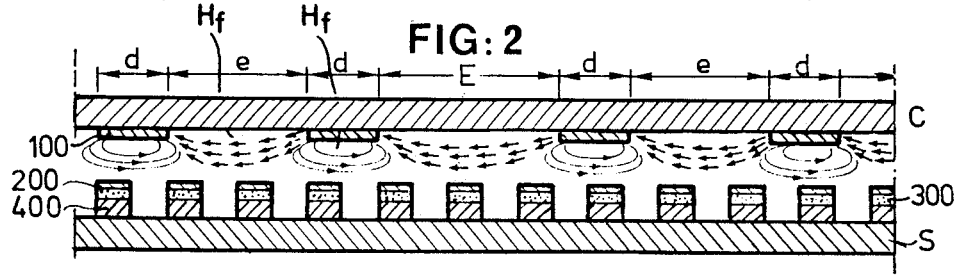
FIG:2
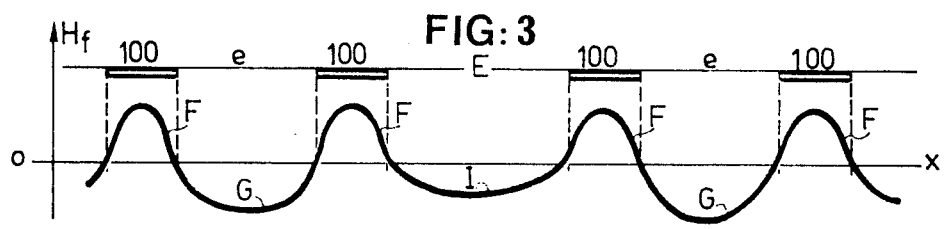
FIG:3
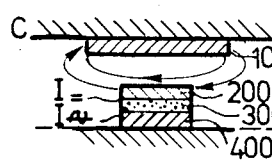
FIG:4
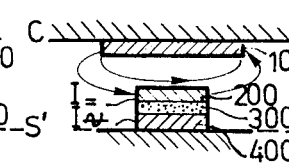
FIG:5
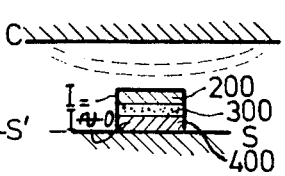
FIG:6
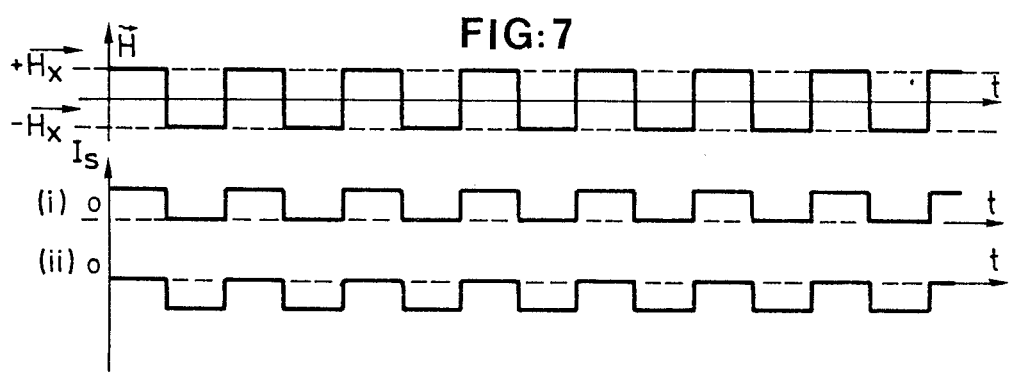
FIG:7

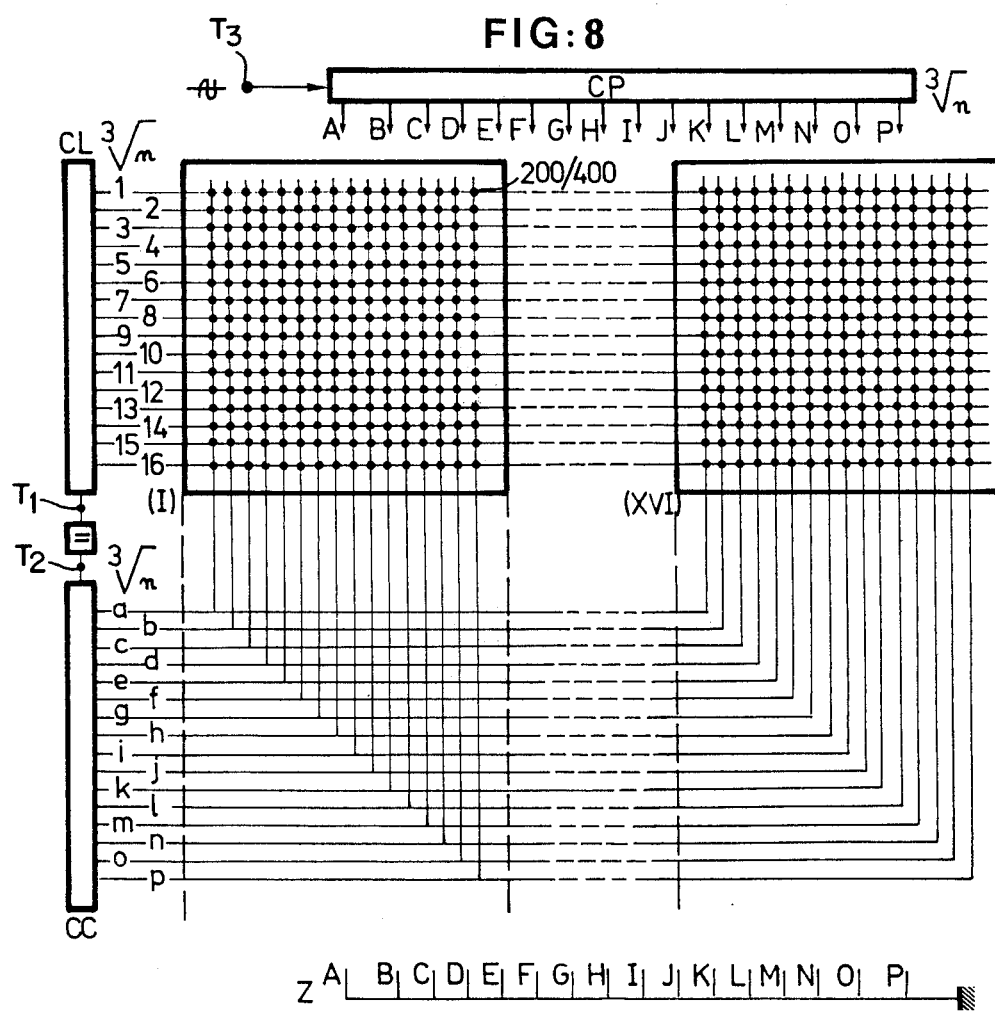
FIG:8
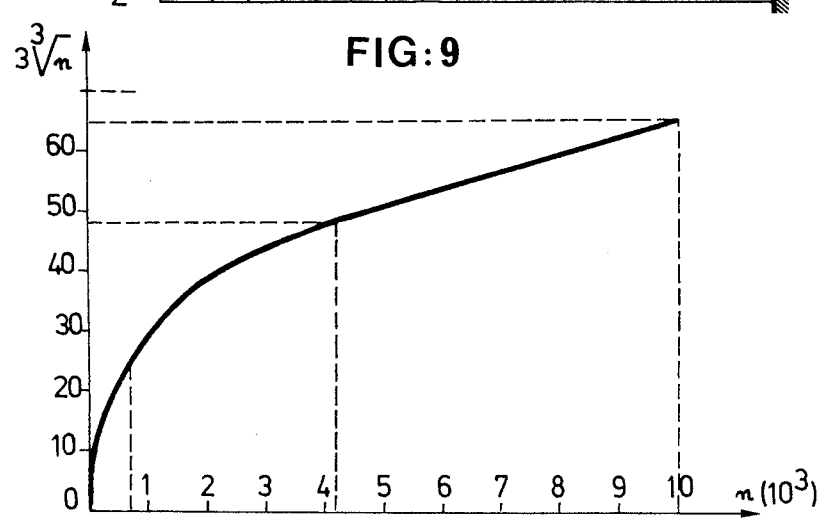
FIG:9

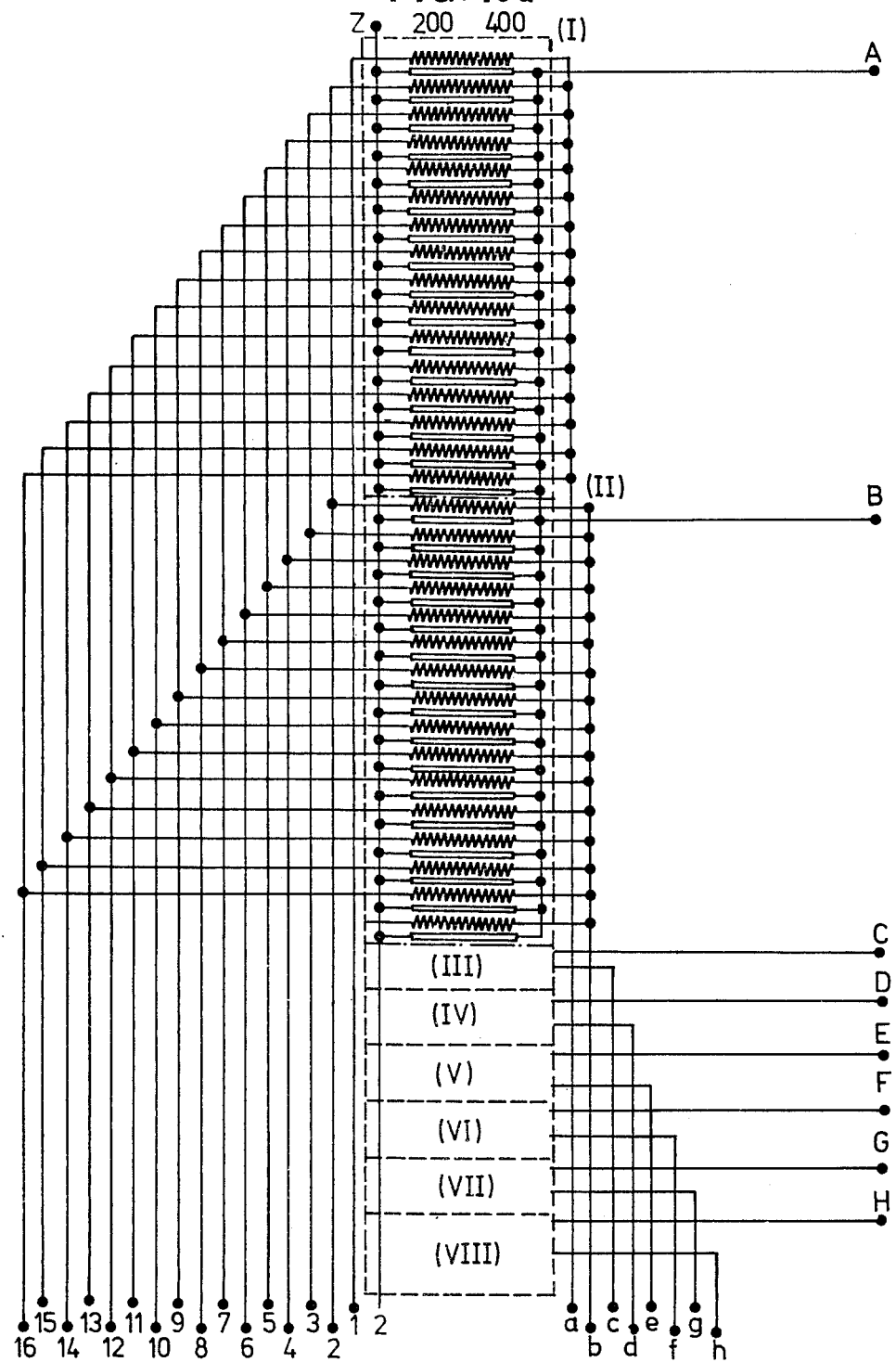
FIG: 10a

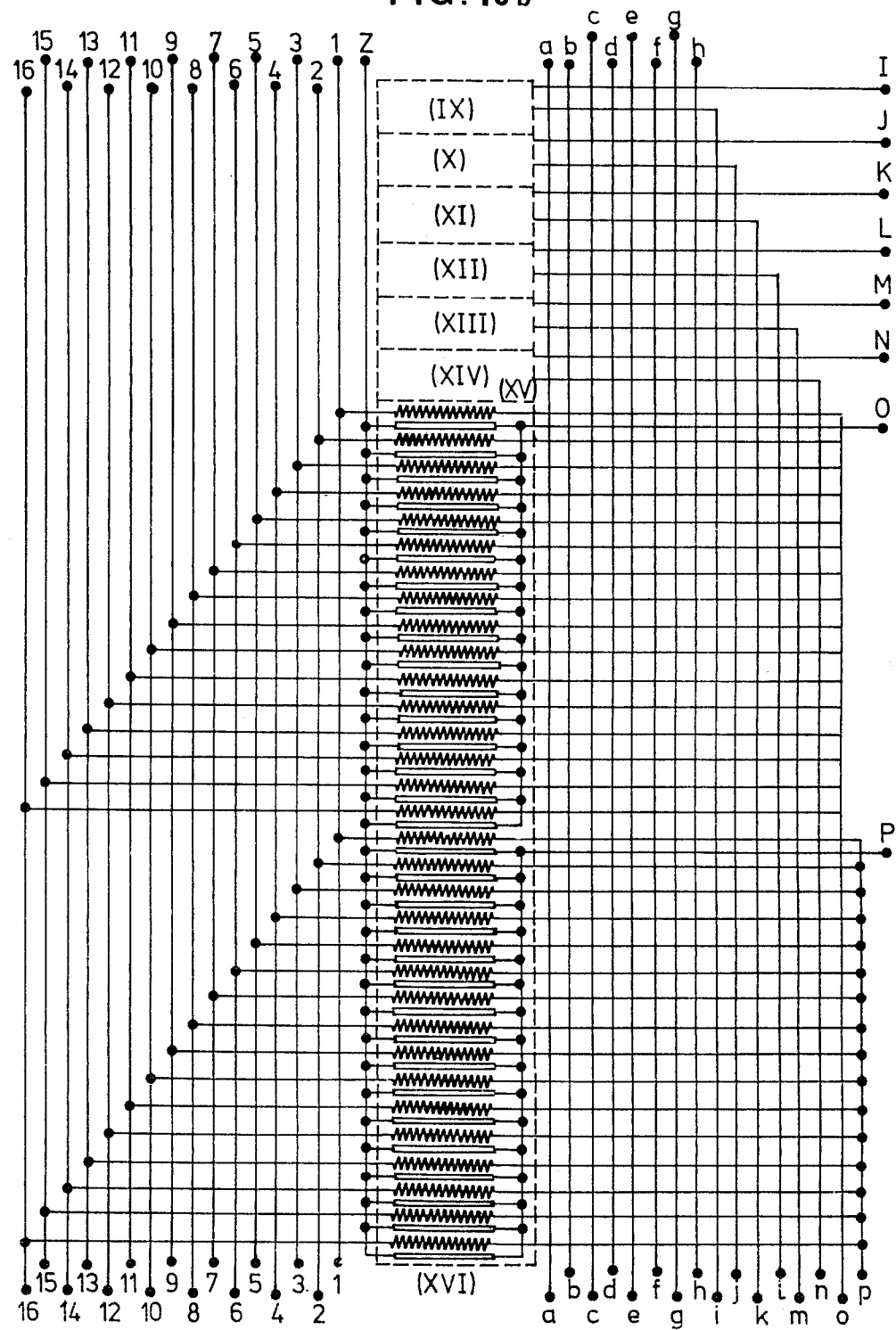
FIG: 10b

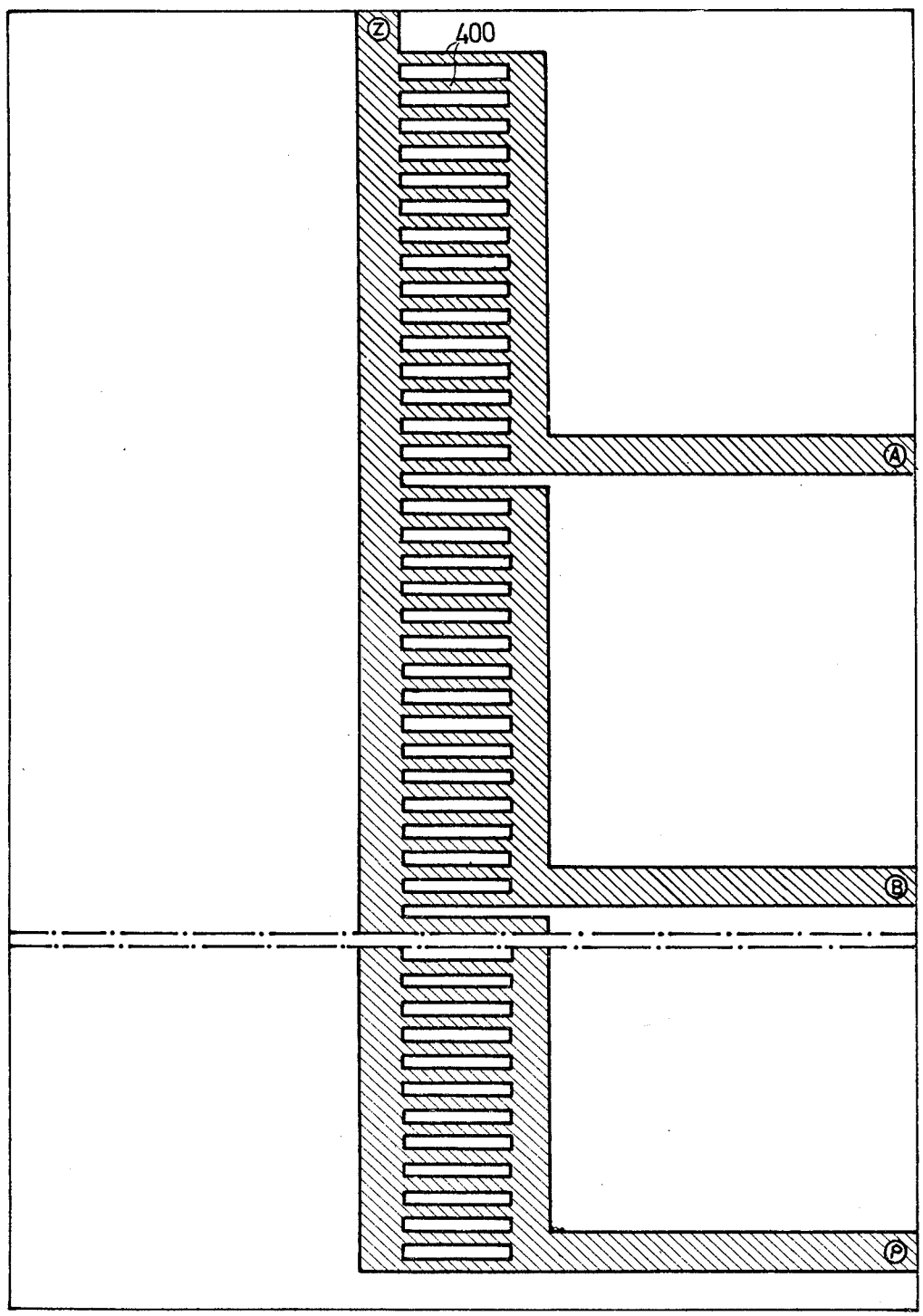
FIG:11

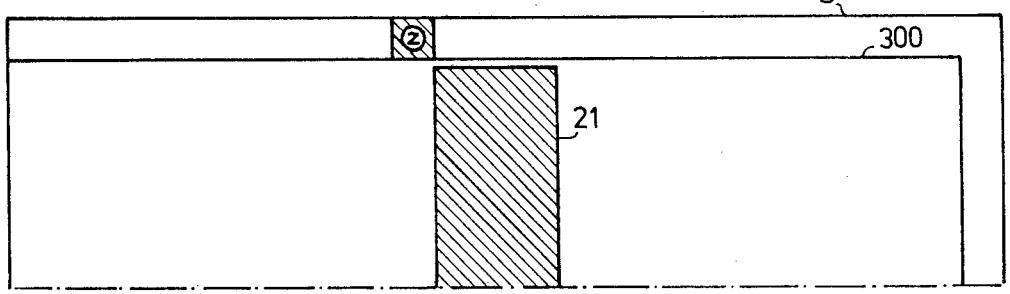
FIG:12
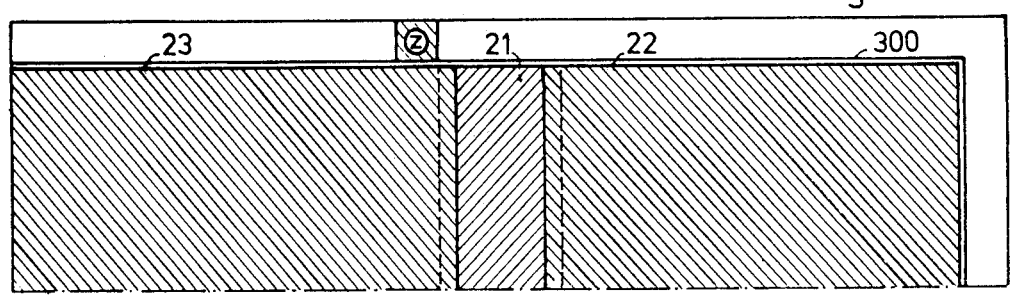
FIG:13
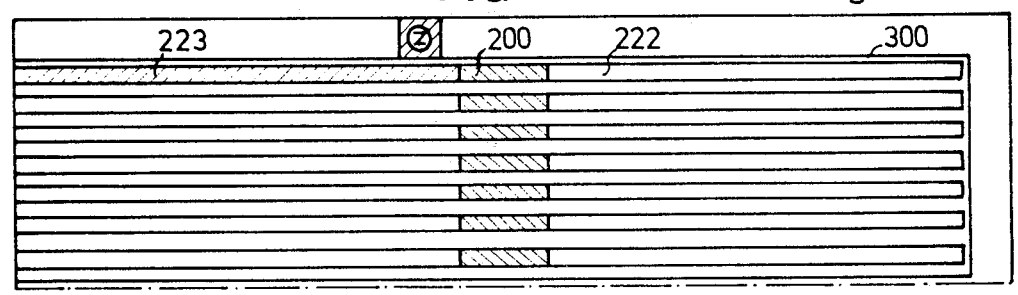
FIG:14
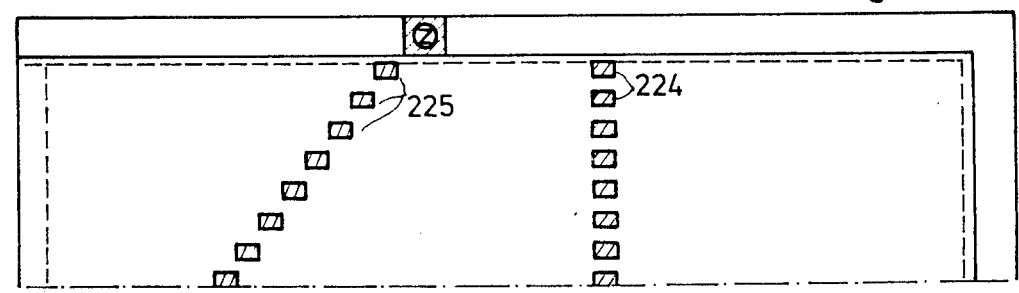
FIG:15

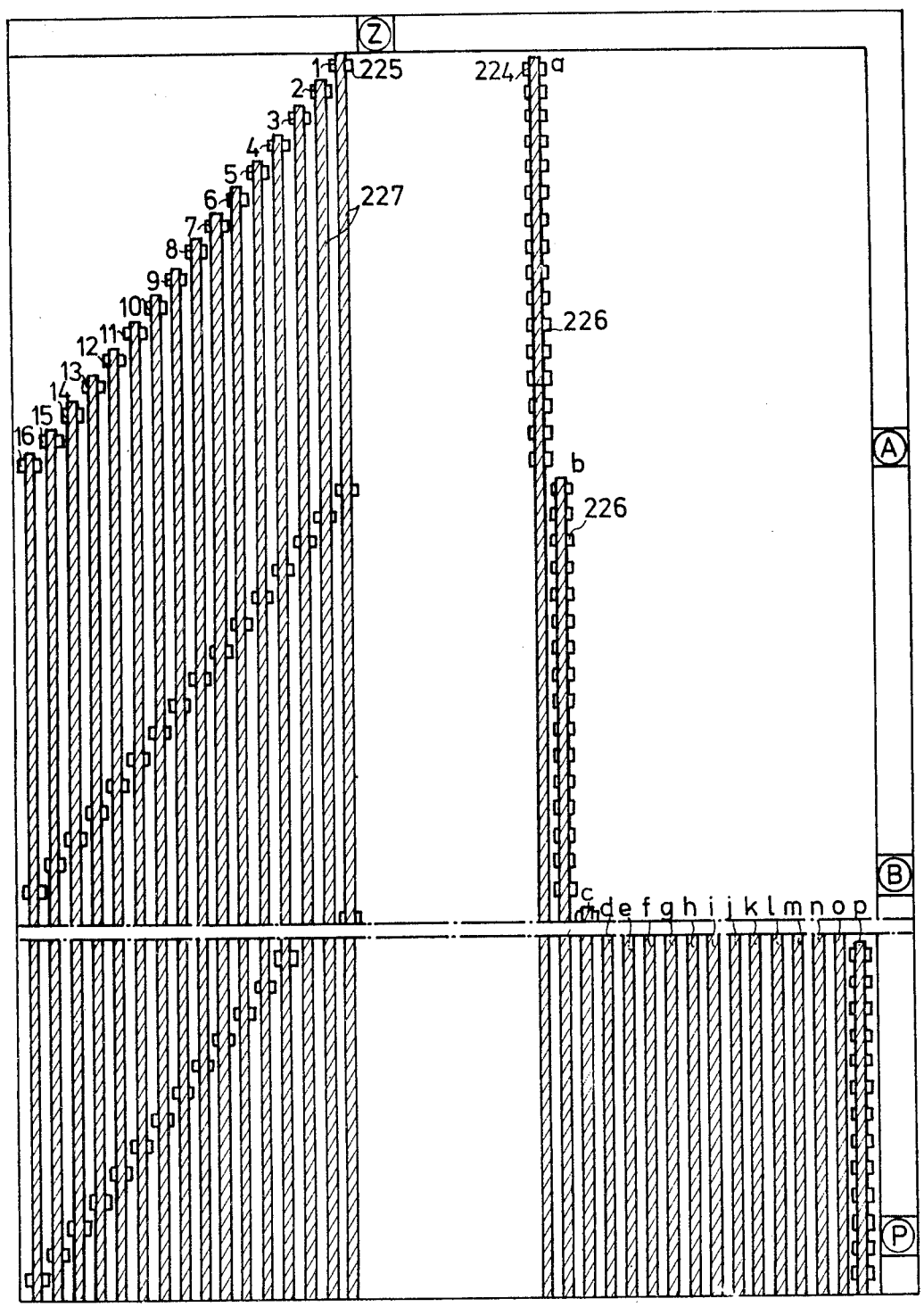
FIG: 16

DEVICE FOR DETECTING MAGNETIC FIELDS AND METHOD OF MAKING SAME

FIELD OF THE INVENTION

The present invention relates to detecting magnetic fields and to a method of producing a magnetic field detecting device. More particularly, the invention relates to reading coded magnetic information written in magnetic ink, such as exists on checks and magnetic tape.

BACKGROUND OF THE INVENTION

Data processing systems frequently include data input devices employing slips bearing coded magnetic information. Examples of these slips are bank checks, post office checks or credit cards. The magnetic coded information generally includes a series of alpha-numeric characters printed on the slips; the characters are a succession of letters of the alphabet, figures, punctuation marks, etc. If the slip is a check, the alpha-numeric characters indicate the check number and/or the account number of the drawer. Each character is formed by a group of bars composed of magnetic ink. The number of bars, the distance between them, and the relative disposition of the bars are individual to each character and conform to known codes, such as the CMC7 code. For simplicity, the present invention is described as it applies to a check reading device but the invention also applies to any system in which it is necessary to detect a magnetic field.

A check reader converts the coded magnetic information represented by the characters printed on the check into a series of electrical signals. The signals are changed by electronic shaping circuits into a series of square wave electrical pulses which are fed to electronic circuits that recognize the characters printed on the check. When the characters corresponding to this series of square wave electrical pulses, which correspond in turn to the printed characters, have been identified, a calculating unit in a data processing system of which the check reader is a part performs operations relating to the check; exemplary of the operations are debiting, crediting and updating the account of the drawer.

To enable the invention to be better understood, the following facts about magnetism are reviewed:

To magnetize a magnetic material in which the magnetic induction is very weak, the material is initially subjected to a positive magnetic field having sufficient strength to saturate the material; that is, the magnetic induction in the material reaches a limiting value $B_s$ when the strength of the magnetic field reaches a certain value $H_s$. The magnetic field is then removed. There remains a non-zero magnetic induction ($+Mr$) termed the residual induction, having an amplitude characteristic of the material. A magnetized magnetic material generates a leakage magnetic field H in the immediate vicinity of its surface. The magnetic flux of a magnetic field H through an area S is equal to the product of the strength of field H multiplied by the size of the areas.

Check readers generally comprise a magnetizing device and a magnetic transducer. The magnetizing device magnetizes character bars printed on the check to render the value and sense of the magnetic induction in all the bars identical. This is necessary because printing the characters on the check causes the induction of the bars to be zero or the value and polarity of the magnetic induction to vary from one bar to the next throughout the bars. Thus, the magnetic induction in the bars equals the residual induction of the magnetic ink when the bars are no longer subject to the magnetic field of the magnetizing device.

The magnetic transducer device derives an electric signal in response to the magnetic leakage field set up by the bars magnetized by the magnetizing device. The signal is supplied to the previously mentioned electronic shaping circuits. In other words, the magnetic transducer device detects the presence of the bars.

The check is positioned in and moved by a mechanical check transporting device so that all the bars pass in succession in front of the magnetizing and transducer devices, which are in close proximity to each other.

Existing magnetic transducer devices employing at least one magnetoresistor are simple, inexpensive and highly reliable in detecting the presence of bars, while being insensitive to the speed of the bars relative to the transducer device. Magnetoresistors are electrical resistors having variable resistance values as a function of the magnetic field to which they are subjected. Typically, magnetoresistors are thin films or layers of very shallow depth (being a few hundred Angstroms to a few microns thick) deposited on an insulating substrate. Assume that a resistor R is connected to the terminals of a generator having an output current I, whereby a voltage V is developed across the magnetoresistor. When a bar passes in front of the magnetoresistor, the flux, H, of the bar magnetic leakage field causes a change, $\Delta R$, in the value of R with a resulting voltage change $\Delta V$. The equal ratios $\Delta V/V$ and $\Delta R/R$ are termed the coefficient of magnetoresistance, which is usually on the order of 0.5 to 2% and is very often negative.

An electric signal corresponding to the value of $\Delta R$ is amplified and supplied to the aforementioned shaping circuits. This signal is unaffected by the speed of the bars relative to the magnetoresistor.

Presently, magnetic transducer devices employing magnetoresistors usually employ two or three magnetoresistors that detect the presence of several bars deposited at a distance or pitch p from one another, on a single insulating substrate. The substrate is moved relative to the magnetoresistors so the bars pass in turn in front of each of the magnetoresistors. The distance p depends on the width of the bars and the maximum and minimum spacing between them. Such a device is described in an article entitled "Dual Stripe Magnetoresistive Read Heads for Speed Insensitive Tape Readers" by G. E. Moore, Jr. and Lijote, published in the "IEEE Transactions on Magnetics", vol. 12, number 6, November 1976.

Since the signal derived from the magnetoresistors is independent of the speed of the characters relative to the magnetoresistors it is possible in theory to detect the presence of bars by stopping a bar carrying a check in front of the magnetoresistors, i.e., by maintaining the check stationary in front of the magnetoresistors. Existing magnetoresistor magnetic transducer devices do not use this advantage because they contain a relatively small number of magnetoresistors; the number of magnetoresistors is very much smaller than the number of bars in the characters printed on the checks.

To exploit this advantage, it is necessary to use a very large number of equidistantly positioned magnetoresistive elements (a few hundred or even a few thousand).

The pitch p must depend on the width of the bars and the maximum and minimum spacing between them. By placing the check in front of the magnetic transducer device it is possible, in response to the amplitude of the output signal developed across each magnetoresistive element, to detect whether or not a bar is in front of the element. From the output signals, the coded magnetic information on the check can be reconstituted without relative movement between the checks and the magnetic transducer device.

Magnetic transducer devices employing a large number of magnetoresistors are disadvantageous because it is necessary to detect resistance changes of 0.5 to 1%. Such small resistance changes must be detected because hundreds or even thousands of magnetoresistive elements are required in the transducer device. Manufacturing such a large number of these elements to standards of consistency is unrealistic using existing technology.

BRIEF DESCRIPTION OF THE INVENTION

The present invention enables this drawback to be overcome by providing each of the magnetoresistive elements with an associated conductor which is magnetically coupled to the element but is otherwise isolated from the element. The conductor is supplied with an alternately positive and negative energizing current to function effectively as a one turn coil that couples a magnetic field having opposite polarity alternating fluxes to the element. The alternating fluxes are superimposed on the magnetic leakage field of the bars.

Depending upon the relative polarities of the fields established by and the leakage field of the bars, a DC current supplied to each of the magnetoresistive elements is modulated so it is in or out of phase with the conductor energizing current. The presence of a bar is detected by phase comparing these two currents, in contrast to amplitude detection, as in the prior art.

The resulting magnetic field detecting device for sensing the presence of check bars is relatively simple and inexpensive and eliminates the need for the delicate, expensive and bulky mechanical check transporting device. When the detecting device according to the invention is used to detect magnetic information, as derived from bars forming characters printed on checks, a plurality of detecting devices according to the invention are positioned opposite the bars.

If n magnetoresistive elements are in the magnetic transducer device, these elements include a maximum of 2n connecting terminals. If the distance p between adjacent magnetoresistive elements is very small, it is virtually impossible from a practical point of view to make 2n connections. It is therefore necessary to optimize the number of connections. In a particular embodiment of the transducer device according to the invention, the magnetoresistive elements are interconnected between rows and columns of a two-dimensional matrix, similar to those employed in binary data memories. Systematic switching between the lines and columns at a specific rate, suited to the way the electrical output signals from the said elements are stored, allows the transducer magnetoresistive elements to be operated with only 2 $\sqrt{n}$ connections (where $\sqrt{n}$ is a whole number, so the matrix is preferably square).

It is not essential for the energizing current to be applied at all times to all the magnetoresistive elements. By spatially switching the applied current as a function of time, a system having three constraints is provided.

In a preferred embodiment of the invention, the connections are laid out in a three-dimensional matrix. The number n of magnetoresistive elements, and thus of conductive elements, is selected so that the cube root of this n ($\sqrt[3]{n}$) is an integer. The magnetoresistive elements are connected between $\sqrt[3]{n}$ connecting rows and $\sqrt[3]{n}$ connecting columns. The resulting two-dimensional matrix is subdivided among $\sqrt[3]{n}$ connections that apply a cyclic energizing current to the conductors associated with the magnetoresistive elements, hence the imaginary three-dimensional matrix subject to three constraints. The three-dimensional magnetic transducer device thus has only 3 $\sqrt[3]{n}$ connections, which are arranged in only two planes of connecting conductors since the device takes on a strip form because of the lay-out of the magnetoresistive elements and the conductors in the arrangement.

The above and still further objects, features and advantages of the present invention will become apparent upon consideration of the following detailed description of one specific embodiment thereof, especially when taken in conjunction with the accompanying drawing.

BRIEF DESCRIPTION OF THE INVENTION

FIG. 1 is a partial plan view of a document such as a ticket, a check or a file card bearing a row of magnetized bars which represent a code which is to be transposed from a magnetic form to an electrical form by means of a magnetic transducer device according to the invention;

FIG. 2 is a partial side sectional view of a part of the document at the point where the bars are situated, and opposite the document, also in partial cross section, a part of a transducer device formed in accordance with the present invention;

FIG. 3 is a waveform of the variation in the magnetic leakage field Hf along a surface onto which the bars of FIG. 2 are projected;

FIGS. 4 and 5 are illustrations of two examples of cooperation between a magnetized bar and a magnetic field detecting device according to the invention, as dictated by the bar magnetization direction;

FIG. 6 is a schematic illustration of an example where there is no cooperation between a detecting device and a magnetic code when no alternately positive and negative energizing current is supplied to the device;

Figure 2A:
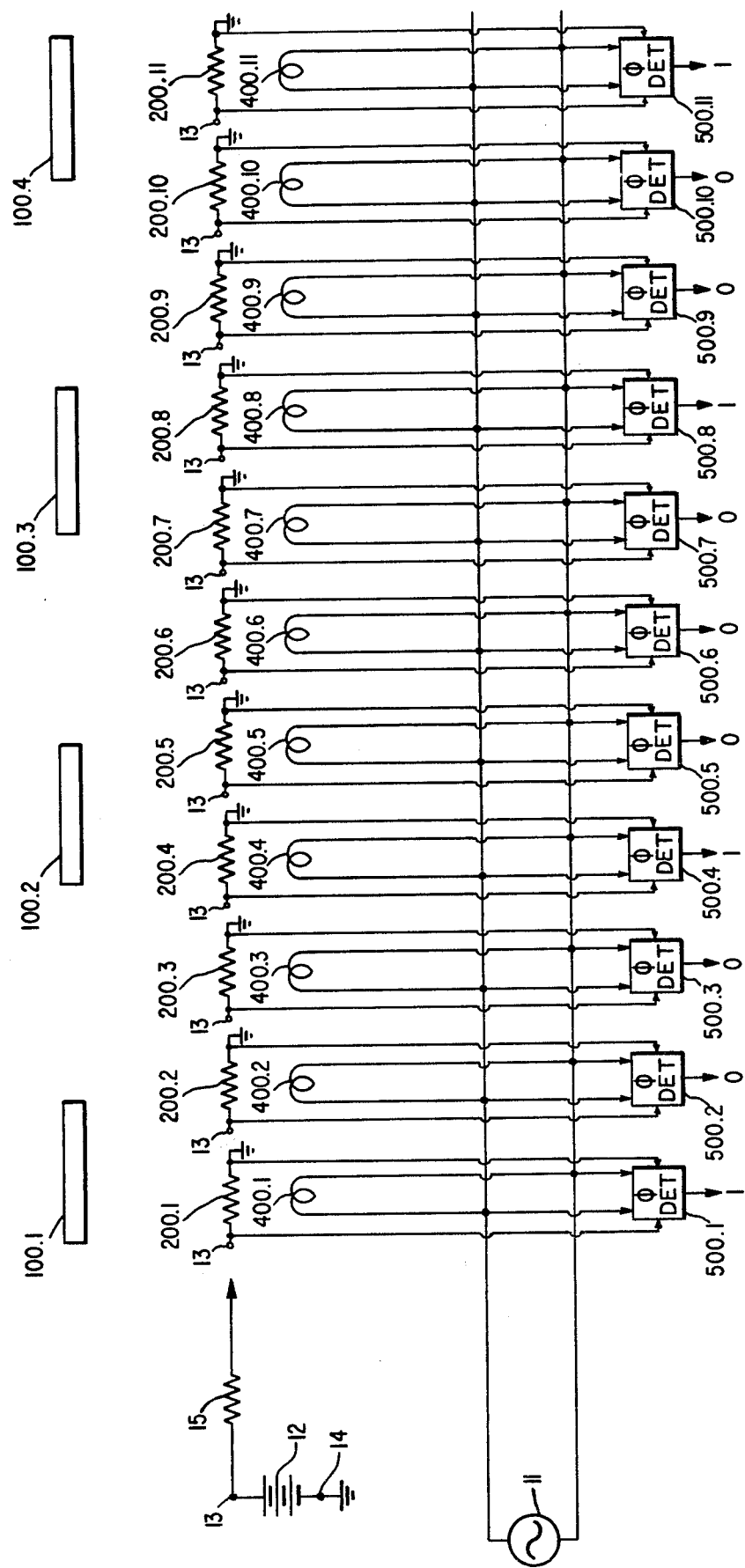
FIG. 2a is a schematic diagram of the segment of the document reading apparatus of FIG. 2.

FIG. 7 includes waveforms of the field variation produced by the energizing current which is applied to the detecting devices of the transducer device according to the present invention and corresponding phase variations for the three cases illustrated in FIGS. 4, 5 and 6;

FIG. 8 is the preferred matrix lay-out of a magnetic transducer device formed in accordance with the present invention and conforming to the structure shown in FIGS. 2, 4 and 6; this three constraint matrix lay-out for the device allows the matrix to be energized and to read and is shown, by way of illustration, as an embodiment having sixteen "sub-matrices" consisting of 256 detecting devices; this lay-out possesses forty-eight connections for a total of 4096 detecting devices;

FIG. 9 is a graph indicating direct correlations for a matrix type connection lay-out of the kind illustrated in FIG. 8 and shown in detail in the following figures;

FIGS. 10a and 10b together illustrate part of the electrical circuit of a magnetic transducer device according to the present invention, (when FIG. 10a is placed above FIG. 10b corresponding conductor rows and columns have the same reference numerals);

FIGS. 11 to 16 are illustrations of various stages in the process of producing a transducer device according to the present invention using a thin film vacuum vapor deposition method wherein: (1) electrical conductors and their connections (FIG. 11) are deposited, (2) the magnetoresistors and individual connections thereof are deposited and shaped (FIGS. 12 to 14), and then (3) the terminals for connecting the conductors together are formed (FIGS. 15 to 16).

DETAILED DESCRIPTION OF THE DRAWING

In FIG. 1, a document C, such as a card or a check, is provided with an identifying code written as magnetized bars 100 that together form a line AB near the card lower edge. Each of bars 100 has the same height, D, and width, d, (FIG. 2). The code is defined by the variations in the intervals between adjacent bars. Adjacent bars are spaced apart either by a "minimum" interval e (typically equal to the width d of a single bar) or by a "maximum" interval E. Reading the code involves determining the sequence of the spacing intervals e and E in the row of bars.

By uniformly magnetizing all of bars 100 in the same direction D, oppositely directed leakage fields Hf of the bars are established in the direction of line AB between adjacent bars in FIG. 2. In FIG. 3 are illustrated the individual leakage fields of bars 100 when projected onto axis Ox, which is orthogonal to the longitudinal axis of the bars and lies in a plane parallel to document C. The overall leakage field Hf includes positive undulations F of substantially the same length as the width as bars 100 and negative undulations G and I having lengths substantially equal to the minimum interval e and maximum interval E between adjacent bars, respectively.

A row of magnetoresistive elements 200, FIG. 2, is positioned parallel to and facing bars 100, along axis Ox. The distance between the plane of the bars and that of the elements is not critical, provided it remains small, being approximately the thickness of an insulating substrate, for example. Each magnetoresistive element 200 is subjected to a leakage field Hf derived from bars 100. The position of each magnetoresistive element 200 relative to bars 100 determines the direction of the net leakage field coupled to the magnetoresistive element. FIGS. 4 and 5 are respectively illustrations of the oppositely directed leakage magnetic fields coupled to magnetoresistive elements 200 by positively and negatively magnetized bars 100 (the terms positively and negatively being randomly assigned). In FIG. 6 is illustrated the leakage fields coupled to a magnetoresistive element 200 facing a "smooth" surface on card C in a region between a pair of adjacent bars 100.

The latter, smooth surface case of FIG. 6 is equivalent to the case shown in FIG. 5. The smooth surface case can also be more broadly interpreted so that a transducer device according to the invention is capable of reading a magnetic code represented by separate bars as well as by magnetization discontinuities in a continuous magnetic strip of height D which is applied to the card between points A and B. There is no need for specific illustration of the discontinuity case as it is merely necessary to assume that in the upper part of FIG. 2, between the illustrated bars 100, there is a magnetic layer across intervals e and E having a magnetization reversed from that of bars 100.

It is known that the resistance R of a magnetoresistive element 200 which is fed with a relatively small DC current I (shown in FIGS. 4–6 as I=) changes when subjected to the leakage field of bars 100. The resistance change, typically of the order of five parts in a thousand can only be detected with existing techniques by comparing the change in voltage at the terminals of each magnetoresistive element with the voltage measured at the terminals of a standard resistor. This procedure is not feasible to identify the coded information since it is not practical to manufacture the magnetoresistive elements with the required standard deviation for dimensions or uniformity. In addition, production tolerances would be prohibitive, with regard to forming the magnetized bars and applying them to a paper carrier. The bars must be applied to the paper as inexpensively as possible to provide an economic magnetic coding system. Hence, there is a need to allow a considerable amount of standard deviation in the magnetization and shape characteristics of the bars.

Thus, in accordance with the invention, alternate positive and negative magnetic field components are superimposed on the leakage fields of bars 100 by forming each magnetic field detecting device of the transducer as a metallic electric conducting film 400 deposited on non-magnetic, dielectric substrate S. Deposited in sequence on conducting film 400 are a non-magnetic, electrically insulating intervening layer 300 and magnetoresistive element 200. Each of conductors 400 is effectively a one turn coil, preferably of the same transverse length and width as each of magnetoresistive elements 200. Each of layers 300 may also be the same length and width as film 400 and element 200; however, layer 300 cannot be smaller in length or width than its corresponding conductor and element to prevent short circuiting between the element and conductor between which the layer is sandwiched. Each of conductors 400 is supplied with an alternating current I, preferably having a square-wave form. However, the AC current may be "pulsed" with unequal positive and negative durations. The current supplied to conductors 400 causes a magnetic field H to be induced in magnetoresistive elements 200 (plane Ox of FIG. 3). The induced magnetic field H varies from a level +Hx to a level —Hx (FIG. 7). When field H is in the same direction as the leakage field Hf of the bar 100 opposite the detecting magnetoresistor 200, the two fields additively combine in the magnetoresistor. If H is sufficiently high relative to Hf, the magnetoresistive element remains polarized in the same direction and there is no change in the voltage across the terminals of the element because the element is magnetically saturated. If, on the other hand, the fields H and Hf are in opposite directions and if H is sufficiently large in comparison with Hf, the magnetization of magnetoresistive element 200 varies with H so a voltage change and signal are derived across the element.

Continuing with the case of FIG. 4 (case i), wherein field Hf is positive, the voltage developed across magnetoresistive element 200 is as shown by current waveform (i) of FIG. 7, wherein there are only positive half wave undulations relative to a zero, base voltage. In the case of FIGS. 5 and 6 where the field Hf coupled to element 200 is negative or zero, current waveform (ii), FIG. 7 represents the negative half wave voltage undulations at the terminals of the magnetoresistive element.

It is clear that the phases of current waveforms (i) and (ii) are opposed. The amplitudes of waveforms (i) and (ii) are defined externally of the reading device proper and do not depend upon the amplitude of the small "signal" resulting from the variation in the DC current I. In prior magnetoresistive systems, the amplitude of the small signal is the criterion to "read" a magnetic discontinuity on a carrier. Thus, in a magnetic transducer device according to the present invention, phase is the discriminating criterion for detecting the presence and absence of magnetized bars 100 and for interpreting the code indicated by the bars. For case (i), FIG. 4, the alternating energizing current for conductor 400 is in phase with current (i) flowing through element 200 during each positive half cycle of the energizing wave and is in phase with current (ii) flowing through element 200 during each negative half wave. A phase discriminating circuit compares the phase of the energizing current, in the present case the current which produces the field H, with the phase of the voltage $\Delta V$ received at the terminals of the magnetoresistive element. It can be seen that the alternating energizing current is in phase with current (i) during each, first positive half wave and in phase with current (ii) during the second, negative half wave.

An exemplary system for detecting the leakage or fringing fields Hf resulting from bars 100, FIG. 2, is illustrated in FIG. 2a. In FIG. 2a, eleven magnetoresistors 200.1–200.11 respectively correspond with magnetoresistors 200 extending from left to right in FIG. 2, while eleven one turn coils 400.1–400.11 respectively correspond with conductors 400, extending from left to right in FIG. 2. Coils 400.1–400.11 are driven in parallel by AC source 11 so that magnetic fields of substantially the same amplitude and phase are derived from them. Magnetoresistors 200.1–200.11 are supplied with a small DC bias current by DC power supply 12, having positive and grounded terminals 13 and 14 connected in parallel to the magnetoresistors via current limiting resistor 15. Associated with and connected to magnetoresistors 200.1–200.11 are phase detectors 500.1–500.11, respectively. Phase detectors 500.1–500.11 respond to the variation in the DC current from source 12, as respectively developed across magnetoresistors 200.1–200.11 and are driven in parallel by AC source 11 so that each phase detector compares the phase of the AC voltages supplied to it by source 11 and its corresponding magnetoresistor. The two voltages supplied to each of phase detectors 500.1–500.11 are either substantially in-phase, i.e., they are phase separated by approximately zero degrees, or out-of-phase, i.e., they are phase separated by approximately 180°. Each of phase detectors includes circuitry to recognize these conditions and derives a bi-level output signal having binary one and zero levels respectively responsive to the in-phase and out-of-phase conditions. For the situation illustrated, wherein bars 100.1, 100.2, 100.3 and 100.4 are respectively facing and in closest proximity to magnetoresistors 200.1, 200.4, 200.8 and 200.11, phase detectors 500.1, 500.4, 500.8 and 500.11 derive binary one levels while phase detectors 500.2, 500.3, 500.5, 500.6, 500.7, 500.9 and 500.10 derive binary zero levels.

In a preferred embodiment of the invention, the magnetoresistive elements 200 of the detecting devices of the magnetic transducer device are made from an anisotropic magnetic material, i.e., a material having two, mutually perpendicular main magnetization directions, referred to as easy and hard magnetization directions. The initial permeability of the material (the extreme value of the ratio B/H, i.e., the flux density to applied field ratio, when H tends towards zero) in the hard magnetization direction is very much greater than that of the material in the easy magnetization direction. The leakage field of bars 100 is perpendicular to the direction of easy magnetization of magnetoresistive members 200.

To achieve satisfactory resolution, the number of magnetic field detecting devices 200 in the transducer device must be greater than the maximum number of bars 100 at minimum spacing e which the interval between points A and B on the document is able to contain. The maximum distance p between detecting devices 200 is equal to the highest divisor common to (d+e) and (d+E). Distance p defines the number of detecting devices; other restrictions on the distance which may be selected are explained in connection with an advantageous reduction in the number of input/output and alternating control connections of the transducer device.

In the case of the transducer device described supra, and as illustrated in FIG. 2a, one pair of connections is provided between each magnetoresistor 200 and each phase detecting device. To avoid the need to have one phase discriminator for each magnetoresistor, recourse is made to sampling the output voltages from the magnetoresistive elements. Sampling may be carried to the point of having only a single phase discriminator external to the transducer device. Sampling may be provided at the transducer device by distributing the alternating current cyclically to the conductive elements associated with the magnetoresistive elements in the device.

Since sampling can be employed, it is possible, in accordance with another feature of the invention which is not necessarily employed in all embodiments, to connect the magnetoresistors in a matrix similar to that employed in a computer memory. The matrix reduces the number of connections and allows each "memory point" for the magnetoresistive elements 200 to be individually selected. With the connections to the magnetoresistive elements arranged in a matrix layout of this kind, each magnetoresistive element has one end connected to a "column" and another end connected to a "row". Each element is fed with DC current by selecting the appropriate row and column with an electronic switching system. This enables the number of connections used to be reduced. For a square matrix containing n detection devices (where n has a whole number as its square root), the number of connections is $2\sqrt{n}$, rather than 2n as is the case for a purely "linear" embodiment of the circuit.

Because conductive elements 400 are responsive to alternating current and in view of what was described in connection with FIGS. 4, 5, 6 and 7, there is a three constraint system with a matrix connection configuration to reduce further the total number of connections, including those to the conductive elements. For this matrix, the number n of detecting elements 200 is as close as possible to the preceding number whose cube root is an integer. The connections to the "rows" and "columns" are subdivided into $\sqrt[3]{n}$ "planes". There are thus $\sqrt[3]{n}$ matrix planes, each containing $\sqrt[3]{n}$ rows and $\sqrt[3]{n}$ columns. The rows and columns of each matrix are respectively connected in series with $\sqrt[3]{n}$ current "inputs" and $\sqrt[3]{n}$ "outputs" for DC current; alternatively, the columns and rows are respectively connected in parallel and series. The conductive elements 400 of the detecting devices in each plane are connected, plane by plane, in parallel to an alternating current circuit, thus providing $\sqrt[3]{n}$ connections to elements 400; all of these parallel AC circuits terminate at a common point, such as ground. There is thus provided a circuit having only $3\sqrt[3]{n}$ connections (plus the common point).

By mathematical theory, it can be shown that the optimum "height" for a matrix is the irrational number "e", i.e., the optimum matrix has 2.718 dimensions; by rounding off the irrational number, the matrix has three dimensions.

FIG. 8 is a diagram of an embodiment of a device possessing all the features which have been mentioned supra; the embodiment of FIG. 8 incorporates an optimized version of the transducer device actuating connections. In the present embodiment of FIG. 8, there are 4096 detecting devices, each indicated by a dot labelled 200/400. The detecting devices are split into 16 planes (I)–(XVI) (only the first and last planes, i.e., planes I to XVI, are illustrated specifically in FIG. 8); each plane includes 256 detecting devices connected to form a two-dimensional square matrix containing 16 rows and 16 columns. Each magnetoresistive element in each plane is connected between a row and a column. One terminal of all of elements 200 in commonly numbered rows 1–16 in all of planes I–XVI are connected in series to each other to one of outputs 1–16, so that correspondingly numbered rows and outputs are connected to each other. Row outputs 1–16 are connected in sequence to a common output terminal $T_1$ by row switch CL. The other terminals of all of elements 200 in planes I–XVI are connected in parallel columns to outputs a–p that are connected to corresponding serial positions of column switch CC. The signals at terminals a–p are sequentially connected by switch CC to terminal $T_2$. Terminals $T_1$ and $T_2$ are connected to a DC source that is series connected with a phase detector also responsive to a reference AC voltage at terminal $T_3$; the series combination of the DC source and the phase detector is indicated on the drawing as "=". The phase detector responds to the phase difference of the AC variation of the DC current derived from the DC source and the AC reference at terminal $T_3$ to derive binary signals indicative of the state of the binary code of bars 100. Thus, for the 4096 magnetoresistive elements 200, there are only thirty-two external connections in two groups of sixteen, i.e., twice the cube root of 4096. The conductive elements 400 associated with magnetoresistive elements 200 are connected in parallel, plane by plane, to be energized by an AC source at terminal $T_3$; the signal at terminal $T_3$ is fed in sequence by switch CP to terminals A–P, one of which is provided for each of the 16 matrices. Each of terminals A–P is connected to all of the columns in its corresponding matrix. There are thus sixteen external connections for the parallel column conductors, bringing the total number of external connections to three times the cube root of the number of detecting devices; thus there are forty-eight connections for 4096 detecting devices (plus the common point).

In operation, the magnetic transducer device is positioned in front of the bars forming the characters printed on the check, without accurate indexing being required. In this application, the length of the magnetoresistive elements 200 in direction D, FIG. 1, is greater than the length of bars 100 in direction D. In a step-wise manner, switch CP applies alternating current from terminal Z to the conductors 400 in planes (I) to (XVI). Each plane is thus selected cyclically, so the magnetoresistive elements in one plane are responsive to the AC fields to derive a signal indicating the direction of the fringing field to which it is responsive and the elements in the other fifteen planes of the matrix do not derive signals. During each step of switch CP, switch CC sequentially connects the magnetoresistors of the columns in the selected plane to terminal $T_2$. Thus, at each step of switch CC, the sixteen points in the same serial position in all of the planes lying along a row which is then connected by switch CL would be selected simultaneously but for the fact that only one of these planes is selected by switch CP. Thus, detecting devices 200 in the matrix of the transducer device are actuated one by one to emit either the signal (i) or the signal (ii) shown in FIG. 7, depending upon the positions of devices 200 relative to bars 100 in the line on the document that is being decoded. The AC source at terminal Z is permanently connected to the phase detector in circuit "=". which thereby derives a binary signal to indicate the phase relation between the AC source and the voltage derived from the selected magnetoresistor.

The principles shown in FIG. 8 are applicable to any other number of detecting devices so that the number of connections equals $3\sqrt[3]{n}$, where n is the number of detecting devices n; this relationship is shown on FIG. 9 where n is expressed as $10^3$.

An electrical circuit diagram for the layout in FIG. 8 is shown in FIGS. 10a and 10b, which are arranged so FIG. 10b is placed underneath FIG. 10a with the connections at the bottom of FIG. 10a and at the top of FIG. 10b corresponding. In this diagram, all of electrical circuits of planes (I), (II), (XV) and (XVI) are shown to provide a direct illustration of the circuits of a transducer device formed on a substrate by integrated circuit techniques. In each "plane", i.e., in each group of sixteen consecutive magnetoresistive elements 200, the left ends (in the drawing) of the elements are connected to individual ones of sixteen connections 1 to 16, orientated perpendicularly to the magnetoresistive elements. The right ends of all sixteen magnetoresistive elements 200 in each "plane" are connected to one of sixteen connections numbered a to p, orientated parallel to connections 1 to 16.

Each magnetoresistive element 200 is associated with a parallel conductive element 400, positioned under its corresponding element 200, as shown in the sectional view of FIG. 2. The right ends of conductive elements 200 in each "plane" are connected in common to one of the "output" terminals A to P that applies the alternating current at terminal $T_3$, as indicated by the diagram shown in FIG. 8. The left ends of all the conductive elements in all the planes are connected to a common point connection Z (in the embodiment shown in FIG. 8 point Z is grounded and terminal $T_3$ is connected to the AC source but point Z could receive the alternating voltage and points A to P could be switched cyclically to ground).

Connection Z is parallel to terminals 1 to 16 and terminals a to p. Terminal Z should be thought of as lying in the same plane as conductive elements 400 and terminals A to P. DC current is supplied to magnetoresistors 200 by terminals 1–16 while pulsed output currents resulting from each test on one of the magnetoresistive elements 200 are extracted from terminals a–p (the functions of terminals 1–16 and a–p may be reversed if desired by the user of the arrangement).

FIGS. 11 to 16 relate to a method of producing the device shown in FIGS. 10a and 10b. The views are only partial but are adequate for comprehension.

Initially, a non-magnetic electrically insulating substrate S is obtained. On substrate S is first deposited a thin layer of a non-magnetic, conductive metal, such as copper. The thickness of the copper layer is of the order of 0.2 microns to a few microns. The thin copper layer is then etched, by a known photo-lithographic process, for example, so that the remaining copper includes an elongated strip with a number of parallel rectangular apertures and protruding fingers, as shown by the hatched portion of FIG. 11. Between adjacent apertures in the strip are the conductive elements 400, having the same width and length as each other and magnetoresistive elements 200 in the plane. Each conductive element 400 links common point connection Z to a group terminal, with each group comprising sixteen conductive elements; terminals A, B and P are the only ones shown in the Figure.

On top of the etched conductive layer is deposited a thin, non-magnetic insulating layer 300, e.g., of silica, having a thickness of the order of 0.1 to a few microns. An insulating layer covers all of the conductive layer except common point Z and terminals A to P.

Over the insulating layer is then deposited a thin band 21, approximately 0.03 to 0.5$\mu$ thick, of magnetoresistive material, for example, a nickel alloy, such as permalloy. The band may, for example, by deposited through a mask. The mask position is adjusted so that it lies above the strip of conductive elements 400 in FIG. 11. The intermediate product is then as shown in FIG. 12.

Deposited through a pair of masks on insulating layer 300, and partially overlapping with the two lateral edges of the magnetoresistive layer 21, are two layers 22 and 23 of copper or some other suitable conductor; layers 22 and 23 do not extend beyond insulating layer 300. Each layer 22 and 23 has a thickness of the order of 0.2 to 2 microns.

The combination of layers 21, 22 and 23 is then etched, by a photo-lithographic process, for example, to form the same number of transverse bands as there are magnetoresistive elements, and thus conductive elements, already formed. Part 200 of each of these transverse bands is of the same size as each of conductive elements 400. The surface of the formed product, as shown in FIG. 14, carries composite bands including conductor 223, magnetoresistor 200 and conductor 222. The detecting devices have actually been formed since, as seen in the vertical section of the drawing, each set of superimposed elements 400 and 200 separated by insulation 300 corresponds to one of the detecting devices shown in FIG. 2.

The product is then coated with a second insulating layer 500 of the same dimensions and material as layer 300. Openings, such as 224 and 225 are then etched in insulating layer 500. Openings 224 are aligned vertically in groups of sixteen on the right side, each line being staggered slightly from the previous line. Openings 225 are staggered towards the left above one another in repeated groups of sixteen over the height of the substrate. FIG. 15 shows the outcome of this deposition and etching of insulating material.

To complete the article, it is then necessary to deposit over the whole area of the insulating material 500 a top layer of a conductive but non-magnetic metal, of a thickness of the order of 0.2 to a few microns. The top layer is etched to produce the conductors shown in FIG. 16 to form the final magnetic transducer device according to the present invention. Conductors to terminals 1 to 16 and a to p are connected to individual ones of the bands 223 and 222 through the openings 225 and 224. The connections are made during deposition of the last conductive layer.

As a partial modification to the embodiment described above, the openings 224 may be replaced in groups of sixteen by a single cut out in the insulating layer 500.

The exposed edges of the substrate wires are soldered for connection to circuits external to the forty-eight functional connections of the article.

While there has been described and illustrated one specific embodiment of the invention, it will be clear that variations in the details of the embodiment specifically illustrated and described may be made without departing from the true spirit and scope of the invention as defined in the appended claims.

What is claimed is:

1. Apparatus for detecting a magnetic field in a region comprising a magnetoresistive element responsive to a DC energizing current, means for applying an alternating magnetic field of predetermined frequency and phase to the element, said element being responsive to the magnetic field in the region and the alternating magnetic field so that the fields are combined in the element to modulate the energizing current, whereby the energizing current in the element has an AC component at the predetermined frequency and a phase determined by the phase of the alternating magnetic field and the field in the region, and means for comparing the predetermined phase with the phase of the AC component to detect the field.

2. Apparatus for reading coded fringing magnetic fields established by magnetic bars having parallel longitudinal axes on documents, said fringing fields extending in opposite directions in response to the magnetic polarization directions of the bars, comprising an array of magnetoresistive elements responsive to a DC energizing current, at least one of said elements being provided for each of the fields, said elements being adapted to be positioned to be responsive to the fringing fields, means for applying an alternating magnetic field of predetermined frequency and phase to each of the elements, said alternating magnetic field being superimposed on the fringing field coupled to each element so that the alternating and fringing fields are combined in each element to modulate the energizing current at the predetermined frequency with a phase determined by the phase of the alternating magnetic field and the fringing field direction, and means for comparing the predetermined phase with the phase of the modulated AC component in each element.

3. The apparatus of claim 2 wherein there are first and second predetermined spacings between the longitudinal axes of adjacent bars, the spacing between adjacent elements being equal to the highest common divisor for the first and second predetermined spacings.

4. The apparatus of claim 3 wherein the means for applying the alternating magnetic field to each element comprises a conductor effectively formed as a one turn coil.

5. The apparatus of claim 4 wherein the means for applying the alternating field to each element comprises a square wave source coupled to the conductor.

6. The apparatus of claim 3 wherein opposite terminals of each of the elements are connected to a column and a row at an intersection of a matrix.

7. The apparatus of claim 6 wherein the conductors and elements are connected in a three-dimensional matrix.

8. The apparatus of claim 7 wherein n elements are included in a matrix having $\sqrt[3]{n}$ planes, each including $\sqrt[3]{n}$ columns and $\sqrt[3]{n}$ rows.

9. The apparatus of claim 2 wherein the phase detecting means includes means for selectively connecting the elements to a common phase detecting circuit.

10. The apparatus of claim 2 wherein the selective connecting means includes a matrix having columns and rows, opposite terminals of each of the elements being connected at an intersection of each row and column.

11. The apparatus of claim 10 wherein the means for applying the AC magnetic field to each element comprises a conductor effectively formed as a one turn coil.

12. The apparatus of claim 11 wherein opposite terminals of each of the elements are connected to a column and a row at an intersection of a matrix.

13. The apparatus of claim 12 wherein the conductors and elements are connected in a three-dimensional matrix.

14. The apparatus of claim 2 wherein the means for applying the alternating magnetic field to each element comprises a conductor effectively formed as a one turn coil, and further including a non-magnetic, dielectric insulating substrate carrying corresponding conductors and elements in registration, said conductors and elements being mutually insulated metal films on the substrate.

15. The apparatus of claim 14 wherein the elements are formed as an anistropic magnetic metal film.

16. The apparatus of claim 15 wherein one of the metal films is deposited directly on the substrate and further including a non-magnetic dielectric film sandwiched between the metal films.

17. Apparatus for enabling fringing magnetic fields established by magnetic bars having parallel longitudinal axes on documents to be read, said fringing fields extending in opposite directions in response to the magnetic polarization directions of the bars, comprising an array of magnetoresistive elements adapted to be responsive to a DC energizing current, at least one of said elements being provided for each of the fields, said elements being adapted to be positioned to be responsive to the fringing fields, a conductor effectively forming a single turn coil adapted to apply an alternating magnetic field of predetermined frequency and phase to each of the elements, said alternating magnetic field being superimposed on the fringing field coupled to each element so that the alternating and fringing fields are combined in each element to modulate the energizing current at the predetermined frequency with a phase determined by the phase of the alternating magnetic field and the fringing field direction, a non-magnetic, dielectric substrate carrying corresponding conductors and elements in registration, said conductors and elements being mutually insulated metal films on the substrate.

18. The apparatus of claim 17 wherein the elements are formed as an anistropic magnetic metal film.

19. The apparatus of claim 18 wherein one of the metal films is deposited directly on the substrate and further including a non-magnetic dielectric film sandwiched between the metal films.

20. The apparatus of claim 17 wherein the elements and conductors are formed as matrices in registration with each other on the substrate.

21. The apparatus of claim 20 further including a plurality of said substrates, each carrying matrices of the elements and conductors in registration.

22. A method of making an apparatus for enabling fringing magnetic fields established by magnetic bars having parallel longitudinal axes on documents to be read, said fringing fields extending in opposite directions to the magnetic polarization directions of the bars, the apparatus including an array of magnetoresistive elements adapted to be responsive to a DC energizing current, at least one of said elements being provided for each of the fields, said elements being adapted to be positioned to be responsive to the fringing fields, a conductor effectively forming a single turn coil adapted to apply an alternating magnetic field of predetermined frequency and phase to each of the elements, said alternating magnetic field being superimposed on the fringing field coupled to each element so that the alternating and fringing fields are combined in each element to modulate the energizing current at the predetermined frequency with a phase determined by the phase of the alternating magnetic field and the fringing field direction, a non-magnetic, dielectric substrate carrying corresponding conductors and elements in registration, said conductors and elements being mutually insulated metal films on the substrate; the method comprising the steps of depositing the conductors as a thin conductive layer over an entire area of the non-magnetic dielectric substrate, etching the conductive layer to form in it, in a single operation, mutually parallel conductive layers and interconnections for groups of the parallel layers to terminals situated at a first edge of the substrate and to a common point situated at a second edge of the substrate, depositing on a part of the conductive layer an insulating layer so only the terminals and the common point are exposed, depositing the elements as a magnetoresistive layer extending over the part of the insulating layer covering the conductive layers, depositing a conductive layer in two parts, each of said parts partially overlapping an edge of the magnetoresistive layer having an orientation perpendicular to that of the underlying line of conductive layers, etching the magnetoresistive layer and the two parts of the conductive layer to form in them bands having magnetoresistive parts aligned with the underlying conductive layers, depositing an insulating layer over the area covered by said bands, etching openings in the insulating layer on either side of the underlying magnetoresistive layers, said openings being aligned in staggered groups in directions perpendicular to that of the bands, the openings being consecutive in each group on one side and spaced apart by the number of bands corresponding to the number of magnetoresistive layers in each group on the other side, depositing a conductive layer over the insulating layer contacting the transverse bands through the openings, and etching the last named conductive layer into bands extending to one edge of the substrate.

* * * * *

UNITED STATES PATENT OFFICE
CERTIFICATE OF CORRECTION

Patent No. 4,197,987     Dated April 15, 1980

Inventor(s) Jean-Pierre Lazzari

It is certified that error appears in the above-identified patent and that said Letters Patent are hereby corrected as shown below:

In Assignee, correct "Compagnie Internationale Pour L'Informatique" to --Compagnie Internationale Pour L'Informatique CII-Honeywell Bull--.

Signed and Sealed this

Fifteenth Day of July 1980

[SEAL]

Attest:

SIDNEY A. DIAMOND

Attesting Officer     Commissioner of Patents and Trademarks